(12) United States Patent
Zhang et al.

(10) Patent No.: US 11,047,903 B2
(45) Date of Patent: Jun. 29, 2021

(54) DISPLAY PANEL AND METHOD FOR TESTING FOR OCCURRENCE OF CRACK IN DISPLAY PANEL

(71) Applicant: Wuhan China Star Optoelectronics Technology Co., Ltd., Wuhan (CN)

(72) Inventors: Xin Zhang, Wuhan (CN); Jingfeng Xue, Wuhan (CN); Siwen Miao, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 148 days.

(21) Appl. No.: 16/484,121

(22) PCT Filed: Apr. 26, 2019

(86) PCT No.: PCT/CN2019/084504
§ 371 (c)(1),
(2) Date: Aug. 7, 2019

(87) PCT Pub. No.: WO2020/107797
PCT Pub. Date: Jun. 4, 2020

(65) Prior Publication Data
US 2020/0174062 A1 Jun. 4, 2020

(30) Foreign Application Priority Data
Nov. 29, 2018 (CN) .......................... 201811446731.3

(51) Int. Cl.
*G01R 31/28* (2006.01)
*G02F 1/1345* (2006.01)
(Continued)

(52) U.S. Cl.
CPC ....... *G01R 31/2825* (2013.01); *G02F 1/1309* (2013.01); *G02F 1/1368* (2013.01);
(Continued)

(58) Field of Classification Search
CPC . G01R 31/2825; G02F 1/1309; G02F 1/1368; G02F 1/136254; G02F 1/13458;
(Continued)

(56) References Cited

U.S. PATENT DOCUMENTS

| 6,064,222 A | * | 5/2000 | Morita | G09G 3/006 |
| | | | | 324/750.3 |
| 2017/0124929 A1 | * | 5/2017 | Track | G09G 3/006 |
| 2020/0203336 A1 | * | 6/2020 | Ren | H01L 23/60 |

FOREIGN PATENT DOCUMENTS

| CN | 203324610 U | * 12/2013 |
| CN | 105976744 | 9/2016 |
| CN | 109493772 | 3/2019 |

OTHER PUBLICATIONS

English translation of Chinese Office Action in application 201811457847.7, which is the Chinese equivalent of U.S. Appl. No. 16/484,117. (Year: NA) (Year: NA).*

* cited by examiner

*Primary Examiner* — Tung X Nguyen
*Assistant Examiner* — Robert P Alejnikov, Jr.

(57) ABSTRACT

A display panel and a method for testing for an occurrence of a crack in a display panel are provided. The display panel includes a panel body, a ground line, a first ground connecting portion, a first testing portion, a second ground connecting portion, a second testing portion, and a switch. By measuring a voltage, a resistance, or a current between the first testing portion and the second testing portion, an open circuit in the ground line and a crack in a non-display area can be detected. Therefore, difficulty of confirming if a crack occurs in the display panel is reduced.

20 Claims, 5 Drawing Sheets

(51) Int. Cl.
*G02F 1/1362* (2006.01)
*G02F 1/1368* (2006.01)
*G02F 1/13* (2006.01)

(52) U.S. Cl.
CPC .... *G02F 1/13458* (2013.01); *G02F 1/136254* (2021.01); *G02F 2203/69* (2013.01)

(58) Field of Classification Search
CPC . G02F 2203/69; G09G 3/006; H01L 23/4985; H01L 27/124
USPC .................................................. 324/760.01
See application file for complete search history.

DISPLAY PANEL AND METHOD FOR TESTING FOR OCCURRENCE OF CRACK IN DISPLAY PANEL

RELATED APPLICATIONS

This application is a National Phase of PCT Patent Application No. PCT/CN2019/084504 having International filing date of Apr. 26, 2019, which claims the benefit of priority of Chinese Patent Application No. 201811446731.3 filed on Nov. 29, 2018. The contents of the above applications are all incorporated by reference as if fully set forth herein in their entirety.

FIELD AND BACKGROUND OF THE INVENTION

The present invention relates to an electronic device field, and particularly to a display panel and a method for testing for an occurrence of a crack in a display panel.

During fabrication of a display panel, an array including multiple display panels is usually fabricated first, and then the multiple display panels are separated by cutting, and a crack is likely to occur in the display panel during the cutting process, leading to failure of the display panel. Therefore, a key step of product quality inspection is whether crack is decided to exist in the display panel after cutting, however, crack is often small and cannot be observed by the naked eye, which greatly increases the difficulty of testing the crack. Therefore, how to realize a display panel and a crack function test and a method for testing for occurrence of a crack in the display panel is an urgent problem.

SUMMARY OF THE INVENTION

The application provides a display panel and a method for testing for an occurrence of a crack in a display panel to reduce the difficulty of testing for an occurrence of a crack in the display panel.

A display panel includes:

a panel body, wherein the panel body includes a display region and a non-display region;

a ground line, wherein the ground line is disposed in the non-display region, surrounds the display region, and includes a first end and a second end;

a first ground connecting portion and a first testing portion, wherein the first ground connecting portion and the first testing portion are parallel electrically connected to the first end;

a second ground connecting portion and a second testing portion, wherein the second ground connecting portion and the second testing portion are parallel electrically connected to the second end; and a switch, wherein the switch is electrically connected between the first ground connecting portion and the first end.

In the display panel of the present disclosure, the first ground connecting portion includes a first ground connecting lead and a first ground connecting pin, the first ground connecting lead is electrically connected between the switch and the first ground connecting pin, the second ground connecting portion includes a second ground connecting lead and a second ground connecting pin, and the second ground connecting lead is electrically connected between the second end and the second ground connecting pin.

In the display panel of the present disclosure, the first testing portion includes a first testing lead and a first testing pin, the first testing lead is electrically connected between the first end and the first testing pin, the second testing portion includes a second testing lead and a second testing pin, and the second testing lead is electrically connected between the second end and the second testing pin.

In the display panel of the present disclosure, the switch is a thin film transistor switch, the switch is disposed in the non-display region of the panel body, and the switch and thin film transistors of the panel body are disposed at a same layer.

In the display panel of the present disclosure, the non-display region is disposed around the display region, the non-display region includes a bonding region, the bonding region is disposed at one side of the display region, the first ground connecting portion, the first testing portion, the second ground connecting portion, the second testing portion, and the switch are disposed in the bonding region.

In the display panel of the present disclosure, the display panel further includes a flexible circuit board, the flexible circuit board is electrically connected to one side of the panel body, and the second ground connecting portion and the second testing portion are disposed at the flexible circuit board.

In the display panel of the present disclosure, the display panel further includes a flexible circuit board, the flexible circuit board is electrically connected to one side of the panel body, and the first ground connecting portion, the first testing portion, the second ground connecting portion, the second testing portion, and the switch are disposed at the flexible circuit board.

In the display panel of the present disclosure, the first end includes a first electrically connecting pad, the second end includes a second electrically connecting pad, the first ground connecting portion and the first testing portion are electrically connected to the first electrically connecting pad, the second ground connecting portion and the second testing portion are electrically connected to the second electrically connecting pad, and the first electrically connecting pad and the second electrically connecting pad are disposed in the non-display region.

A method for testing for an occurrence of a crack in a display panel includes:

providing a display panel, wherein the display panel includes:

a panel body, wherein the panel body includes a display region and a non-display region;

a ground line, wherein the ground line is disposed in the non-display region, surrounds the display region, and includes a first end and a second end;

a first ground connecting portion and a first testing portion, wherein the first ground connecting portion and the first testing portion are parallel electrically connected to the first end;

a second ground connecting portion and a second testing portion, wherein the second ground connecting portion and the second testing portion are parallel electrically connected to the second end;

a switch, wherein the switch is electrically connected between the first ground connecting portion and the first end;

inputting a turn-off voltage to the switch to make an open circuit between the first ground connecting portion and the first end;

measuring a voltage, a resistance, or a current between the first testing portion and the second testing portion; and determining whether a crack exists or not in the non-display region according to the measured voltage, resistance, or current.

In the method for testing for an occurrence of a crack in a display panel of the present disclosure, the step of determining whether a crack exists or not in the non-display region according to the measured voltage, resistance, or current includes:

when the voltage is zero, an open circuit is decided to exist in the ground line and a crack is decided to exist in the non-display region.

In the method for testing for an occurrence of a crack in a display panel of the present disclosure, the step of determining whether a crack exists or not in the non-display region according to the measured voltage, resistance, or current includes:

when the resistance is infinity, an open circuit is decided to exist in the ground line and a crack is decided to exist in the non-display region.

In the method for testing for an occurrence of a crack in a display panel of the present disclosure, the step of determining whether a crack exists or not in the non-display region according to the measured voltage, resistance, or current includes:

when the current is zero, an open circuit is decided to exist in the ground line and a crack is decided to exist in the non-display region.

In the method for testing for an occurrence of a crack in a display panel of the present disclosure, the step of determining whether a crack exists or not in the non-display region according to the measured voltage, resistance, or current includes:

when the voltage is within a preset voltage range, the ground line is normal and a crack is decided to not exist in the non-display region.

In the method for testing for an occurrence of a crack in a display panel of the present disclosure, the first ground connecting portion includes a first ground connecting lead and a first ground connecting pin, the first ground connecting lead is electrically connected between the switch and the ground connecting pin, the second ground connecting portion includes a second ground connecting lead and a second ground connecting pin, and the second ground connecting lead is electrically connected between the second end and the second ground connecting pin.

In the method for testing for an occurrence of a crack in a display panel of the present disclosure, the first testing portion includes a first testing lead and a first testing pin, the first testing lead is electrically connected between the first end and the first testing pin, the second testing portion includes a second testing lead and a second testing pin, and the second testing lead is electrically connected between the second end and the second ground connecting pin.

In the method for testing for an occurrence of a crack in a display panel of the present disclosure, the switch is a thin film transistor switch, the switch is disposed in the non-display region of the panel body, and the switch and thin film transistors of the panel body are disposed at a same layer.

In the method for testing for an occurrence of a crack in a display panel of the present disclosure, the non-display region is disposed around the display region, the non-display region includes a bonding region, the bonding region is disposed at one side of the display region, the first ground connecting portion, the first testing portion, the second ground connecting portion, the second testing portion, and the switch are disposed in the bonding region.

In the method for testing for an occurrence of a crack in a display panel of the present disclosure, the display panel further includes a flexible circuit board, the flexible circuit board is electrically connected to one side of the panel body, and the second ground connecting portion and the second testing portion are disposed at the flexible circuit board.

In the method for testing for an occurrence of a crack in a display panel of the present disclosure, the display panel further includes a flexible circuit board, the flexible circuit board is electrically connected to one side of the panel body, and the first ground connecting portion, the first testing portion, the second ground connecting portion, the second testing portion, and the switch are disposed at the flexible circuit board.

In the method for testing for an occurrence of a crack in a display panel of the present disclosure, the first end includes a first electrically connecting pad, the second end includes a second electrically connecting pad, the first ground connecting portion and the first testing portion are electrically connected to the first electrically connecting pad, the second ground connecting portion and the second testing portion are electrically connected to the second electrically connecting pad, and the first electrically connecting pad and the second electrically connecting pad are disposed in the non-display region.

The present disclosure provides a display panel and a method for testing for an occurrence of a crack in a display panel. The display panel includes a panel body, a ground line, a first ground connecting portion, a first testing portion, a second ground connecting portion, a second testing portion and a switch, the panel body includes a display region and a non-display region, the ground line is disposed in the non-display region and surrounds the display region, the ground line includes a first end and a second end, the first ground connecting portion and the first testing portion are parallel connected to the first end, the second ground connecting portion and the second testing portion are parallel connected to the second end, the switch is electrically connected between the first ground connecting portion and the first end, by measuring a voltage, a resistance, or a current between the first testing portion and the second testing portion, when the voltage is zero, the resistance is infinity or the current is zero, an open circuit is decided to exist in the ground line and a crack is decided to exist in the non-display region, thereby the difficulty of testing for an occurrence of a crack in the display panel is reduced.

BRIEF DESCRIPTION OF THE SEVERAL VIEWS OF THE DRAWINGS

In order to more clearly illustrate the embodiments or the technical solutions in prior art, the drawings to be used in the embodiments or prior art description will be briefly described below. Obviously, the drawings in the following description are merely inventions. For some embodiments, other drawings may be obtained from those skilled in the art without any creative work.

DESCRIPTION OF SPECIFIC EMBODIMENTS OF THE INVENTION

Figure 1:
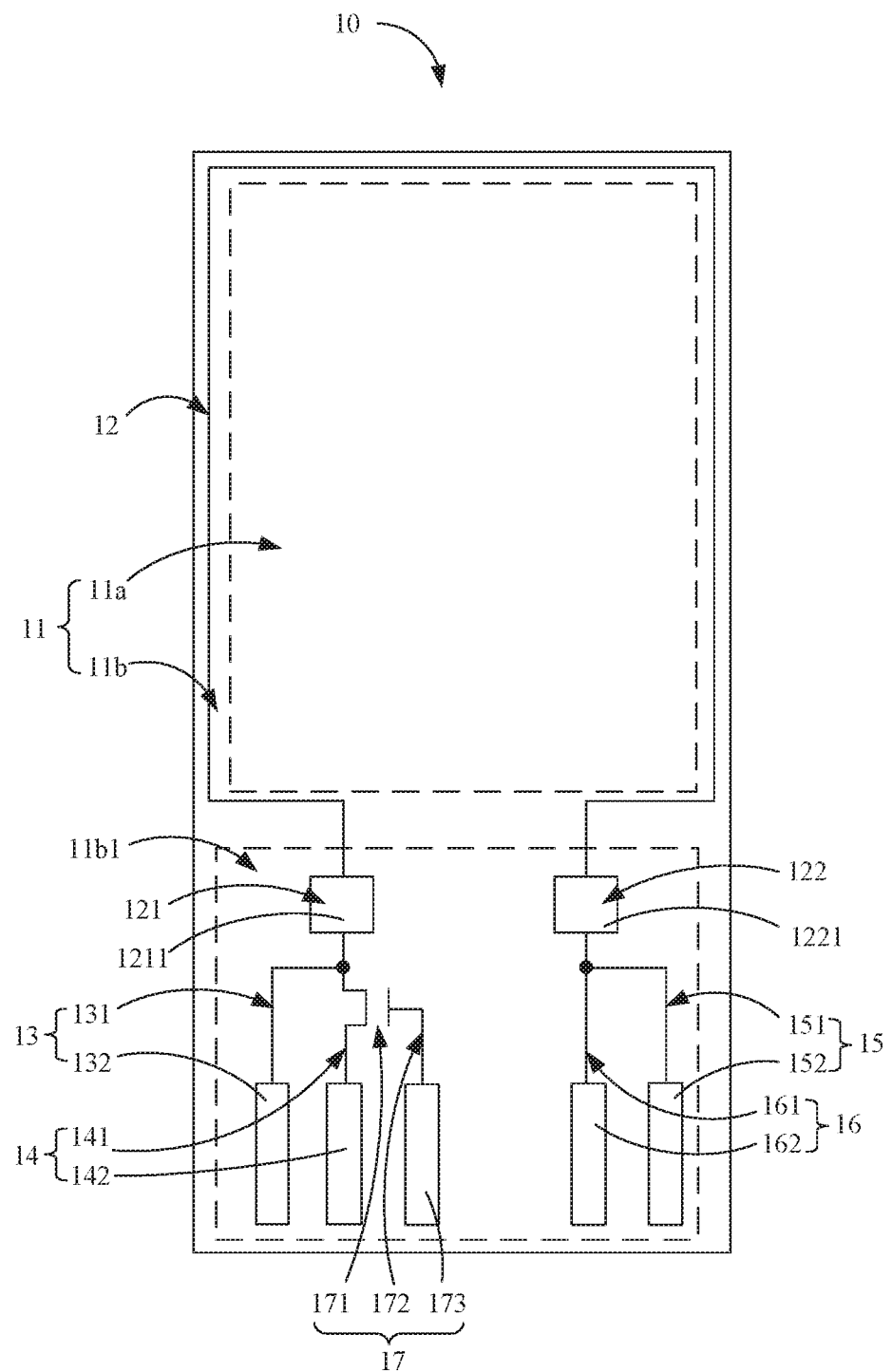
FIG. 1 is a schematic view of a display panel of a first embodiment according to the present disclosure.

Referring to FIG. 1, the present disclosure provides a display panel 10. The display panel 10 includes a panel body 11, a ground line 12, a first ground connecting portion 13, a first testing portion 14, a second ground connecting portion 15, a second testing portion 16, and a switch 17.

The panel body 11 includes a display region 11a and a non-display region 11b. The display panel 10 can be a liquid crystal display panel or an organic light emitting diode display panel.

The ground line 12 is disposed in the non-display region 11b. The ground line 12 surrounds the display region 11a. The ground line 12 includes a first end 121 and a second end 122. The ground line 12 and a metal layer of the display panel 10 are disposed at a same layer.

The first ground connecting portion 13 and the first testing portion 14 are parallel electrically connected to the first end 121. The first end 121 includes a first electrically connecting pad 1211. The first ground connecting portion 13 and the first testing portion 14 are electrically connected to the first electrically connecting pad 1211. The switch 17 is electrically connected between the first ground connecting portion 13 and the first end 121.

The first ground connecting portion 13 includes a first ground connecting lead 131 and a first ground connecting pin 132. The first ground connecting lead 131 is electrically connected between the switch 17 and the first ground connecting pin 132. The first testing portion 14 includes a first testing lead 141 and a first testing pin 142. The first testing lead 141 is electrically connected between the first end 121 and the first testing pin 142.

The second ground connecting portion 15 and the second testing portion 16 are parallel connected to the second end 122. The second end includes a second electrically connecting pad 1221. The second ground connecting portion 15 and the second testing portion 16 are electrically connected to the second electrically connecting pad 1221.

The second ground connecting portion 15 includes a second ground connecting lead 151 and a second ground connecting pin 152. The second ground connecting lead 151 is electrically connected between the second end 122 and the second ground connecting pin 152. The second testing portion 16 includes a second testing lead 161 and a second testing pin 162. The second testing lead 161 is electrically connected between the second end 122 and the second testing pin 162.

In one embodiment, the switch 17 is a thin film transistor switch. The switch 17 and thin film transistors of the display panel 10 are disposed at a same layer.

The switch 17 can include a switch body 171, a switch lead 172 and a switch pin 173. The switch body 171 is electrically connected between the first ground connecting portion 13 and the first end 121. The switch lead 172 is electrically connected between the switch body 171 and the switch pin 173, and a control circuit connected to the switch pin 173 inputs an open voltage or a turn-off voltage to the switch 17.

In one embodiment, the non-display region 11b surrounds the display region 11a. The non-display region 11b includes a bonding region 11b1. The bonding region 11b1 is disposed at one side of the display region 11a. The first ground connecting portion 13, the first testing portion 14, the second ground testing portion 15, the second testing portion 16, and the switch 17 are disposed in the bonding region 11b1. The ground line 12, the first electrically connecting pad 1211, the second electrically connecting pad 1221, the switch lead 172, the first ground lead 131, the second ground lead 151, the first testing lead 141, and the second testing lead 161 and a metal layer of the display panel 10 can be disposed at a same layer. The switch body 171 and thin film transistors of the display panel 10 can be disposed at a same layer. The first ground connecting pin 132, the second ground connecting pin 152, the first testing pin 142, the second testing pin 162, and the switch pin 173 are disposed at an edge of the display panel 10.

Figure 2:
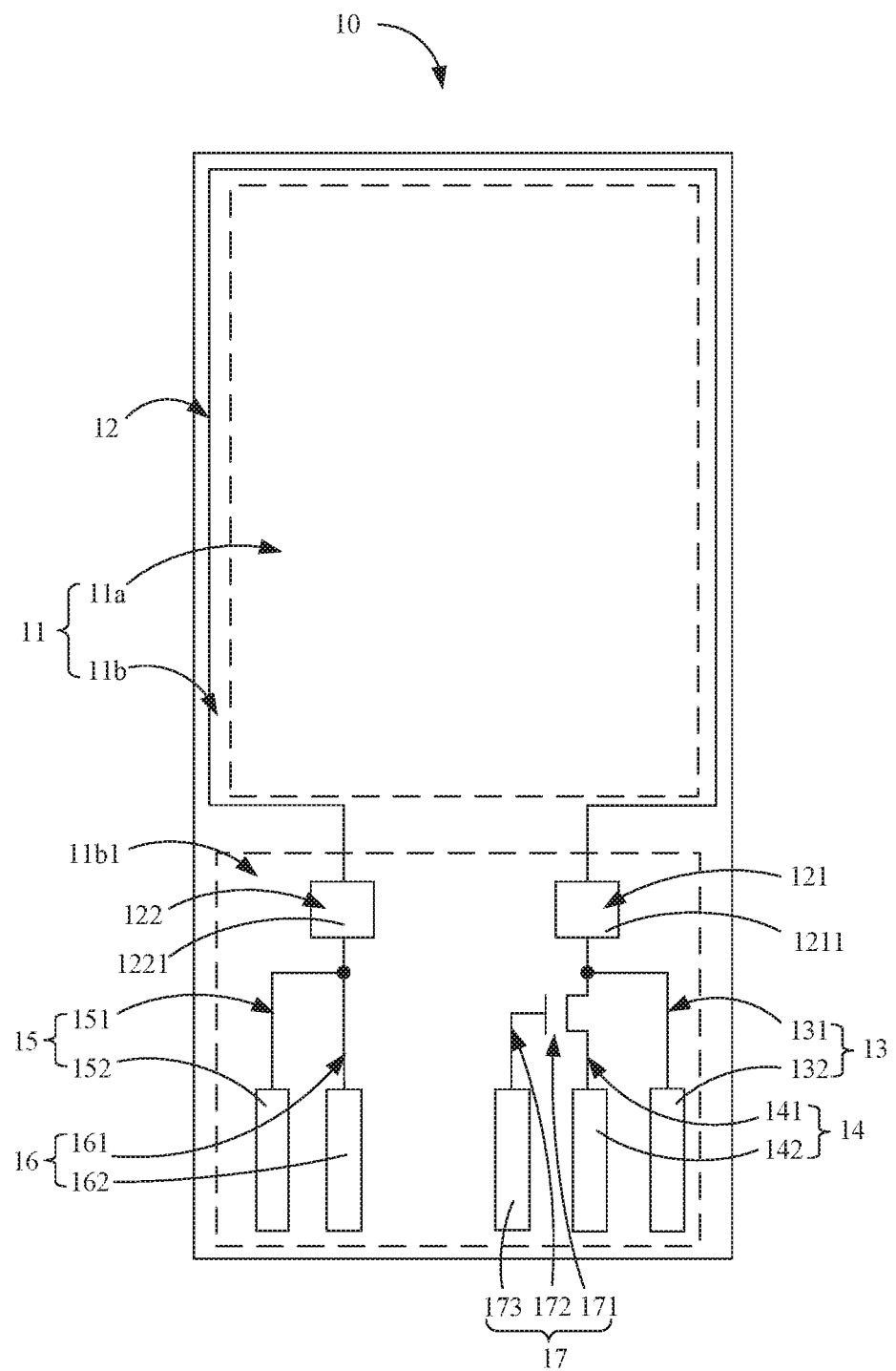
FIG. 2 is a schematic view of a display panel of a second embodiment according to the present disclosure.

Referring to FIG. 2, the present disclosure further provides a display panel 10. The difference between the display panel 10 shown in the FIG. 2 and the display panel 10 shown in the FIG. 1 is the first end 121, the first electrically connecting pad 1211, the first ground connecting portion 13, the first testing portion 14, and the switch 17 of the display panel 10 shown in the FIG. 1 are disposed on a left side of the display panel 10, the first end 121, the first electrically connecting pad 1211, the first ground connecting portion 13, the first testing portion 14, and the switch 17 of the display panel shown in the FIG. 1 are disposed on a right side of the display panel 10.

Figure 3:
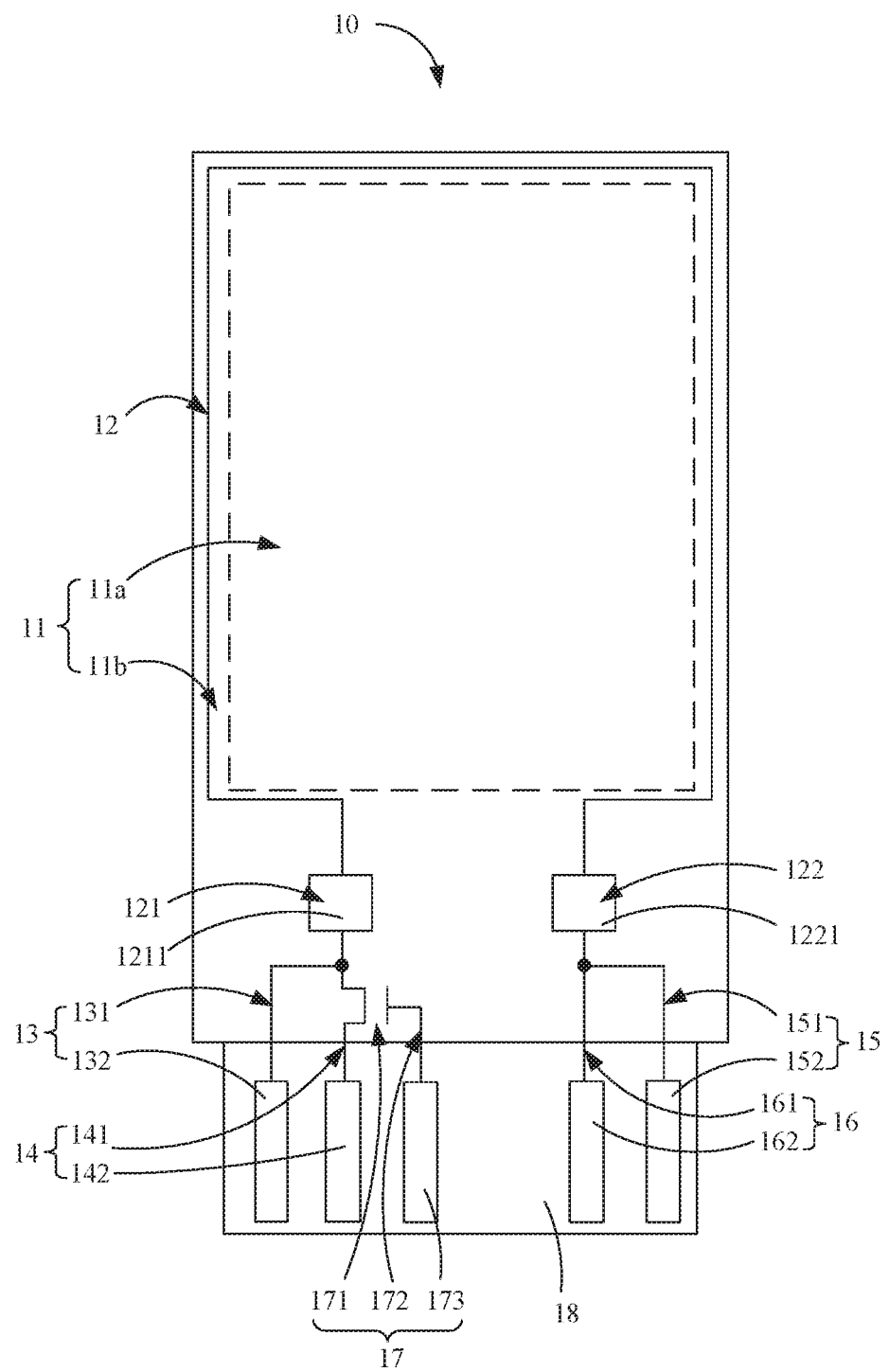
FIG. 3 is a schematic view of a display panel of a third embodiment according to the present disclosure.

Referring to FIG. 3, the present disclosure further provides a display panel 10. The difference between the display panel 10 shown in the FIG. 3 and the display panel 10 shown in the FIG. 1 further includes a flexible circuit board 18. The flexible circuit board 18 is electrically connected to one side of the display panel 10. The ground line 12, the first electrically connecting pad 1211, the second electrically connecting pad 1221, one part of the switch lead 172, one part of the first ground lead 131, one part of the second ground connecting lead 151, one part of the first testing lead 141, and one part of the second testing lead 161 and a metal layer of the display panel 10 are disposed at a same layer, and disposed in the non-display region 11b of the display panel 10 to realize a narrow bezel of the display panel 10. Another part of the switch lead 172, another part of the first ground connecting lead 131, another part of the second ground connecting lead 151, another part of the first ground testing line 141, another part of the second testing line 161, the first ground connecting pin 132, the second ground connecting pin 152, the first testing pin 142, the second testing pin 162, and the switch pin 173 are disposed in the display panel 10. The first ground connecting pin 132, the second ground connecting pin 152, the first testing pin 142, the second testing pin 162 and the switch pin 173 are disposed at an edge of flexible circuit board 18.

Figure 4:
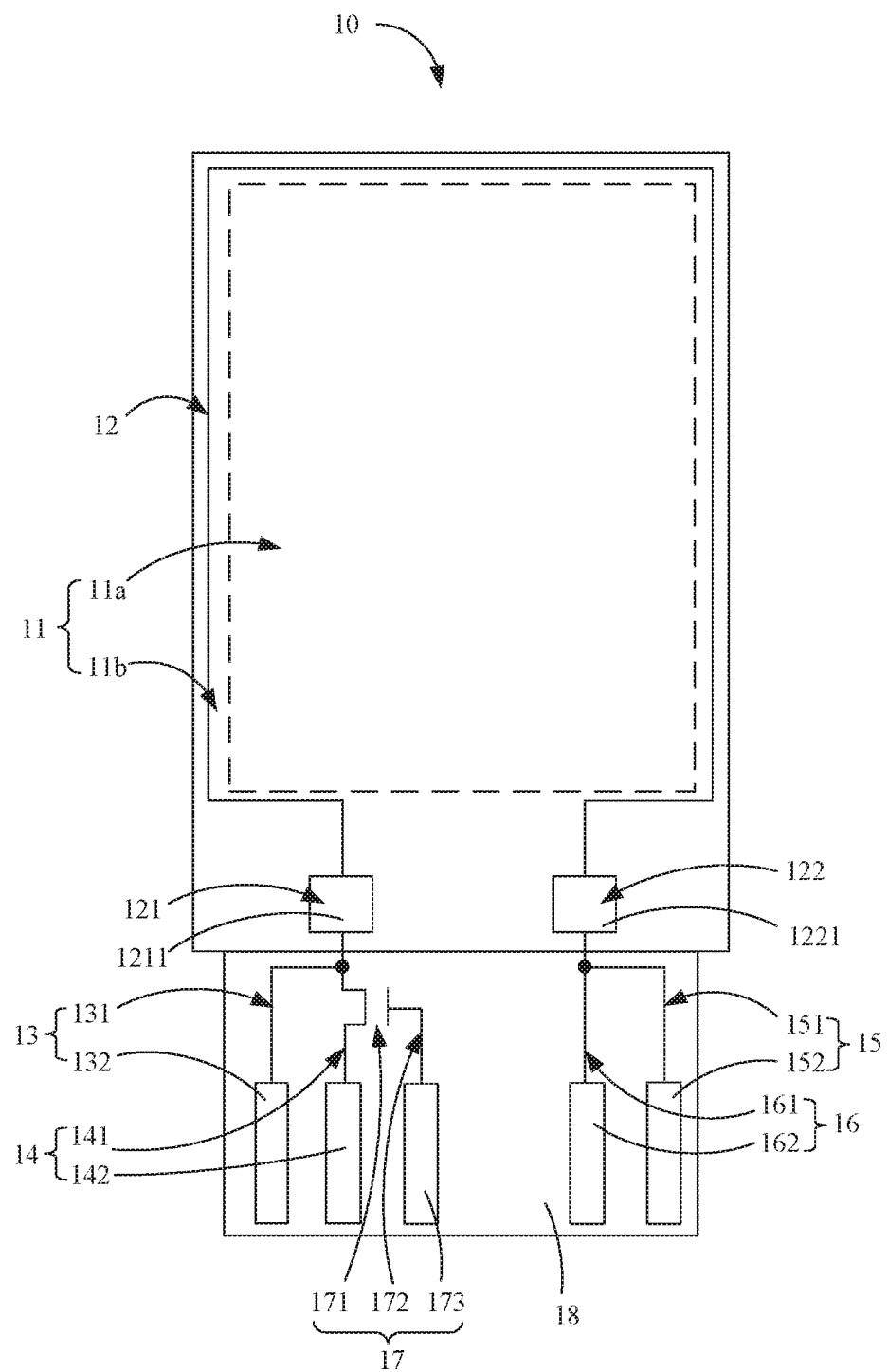
FIG. 4 is a schematic view of a display panel of a fourth embodiment according to the present disclosure.

Referring to FIG. 4, the present further provides a display panel 10. The difference between the display panel 10 shown in the FIG. 4 and the display panel 10 shown in the FIG. 1 further includes a flexible circuit board 18. The flexible circuit board 18 is electrically connected to one side of the display panel 10. The ground line 12, the first electrically connecting pad 1211, and the second electrically connecting pad 1221 and a metal layer of the display panel 10 are disposed at a same layer, and are disposed in the non-display region 11b of the display panel 10 to realize a narrow bezel of display panel 10. The switch 17, the first ground connecting portion 13, the second ground connecting portion 15, the first testing portion 14, and the second testing portion 16 are disposed in the display panel 10, for example, the switch body 171, the switch lead 172, the first ground connecting lead 131, the second ground connecting lead 151, the ground testing line 141, the second testing lead 161, the first ground connecting pin 132, the second ground connecting pin 152, the first testing pin 142, the second testing pin 162, and the switch pin 173 are disposed in the display panel 10. The first ground connecting pin 132, the second ground connecting pin 152, the first testing pin 142, the second testing pin 162, and the switch pin 173 are disposed at an edge of the flexible circuit board 18.

Figure 5:
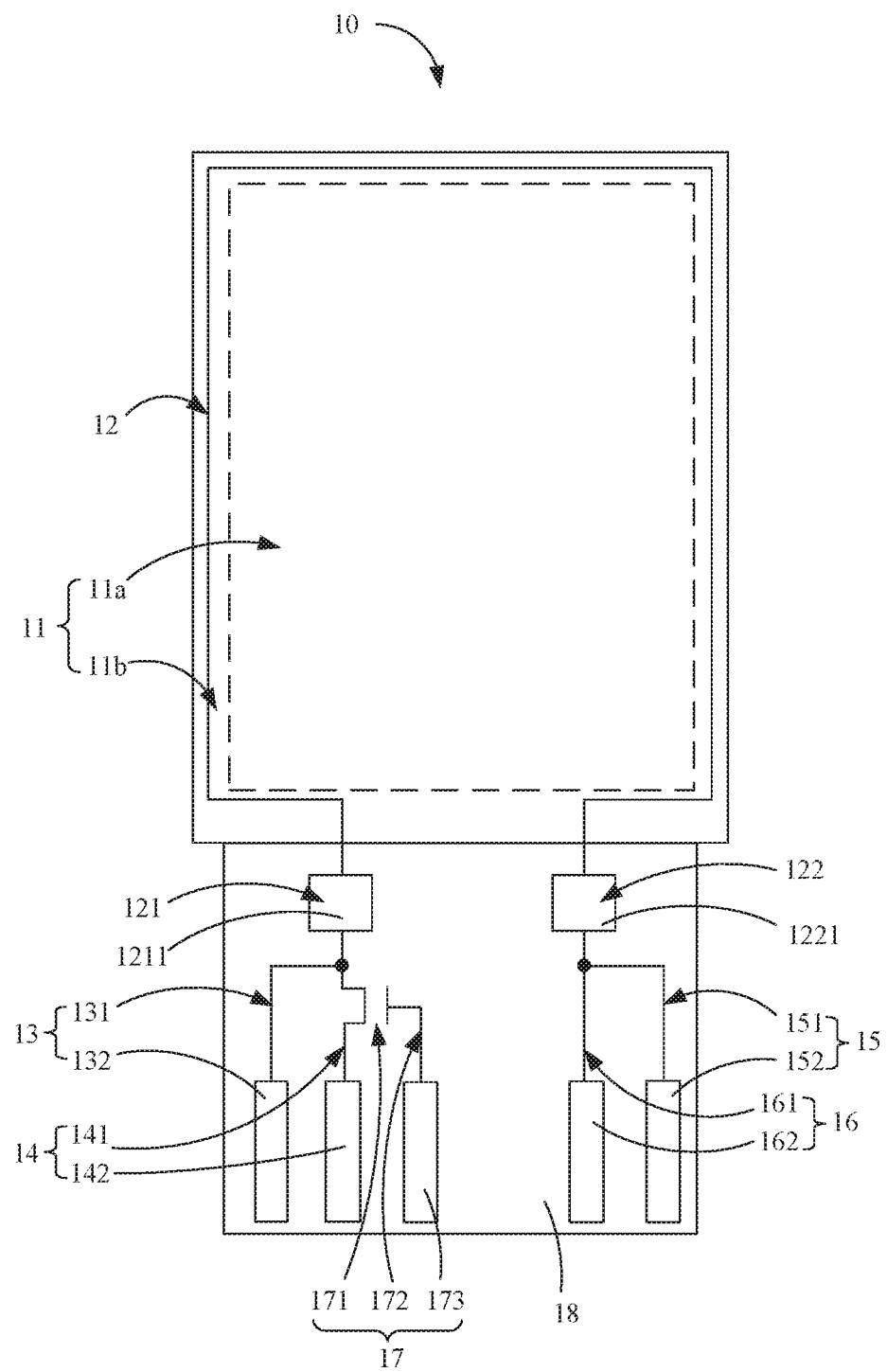
FIG. 5 is a schematic view of a display panel of a fifth embodiment according to the present disclosure.

Referring to FIG. 5, the present disclosure further provides display panel 10. The difference between the display panel 10 shown in the FIG. 5 and the display panel 10 shown in the FIG. 1 further includes a flexible circuit board 18. The flexible circuit board 18 is electrically connected to one side of the display panel 10. The ground line 12 and a metal layer of the display panel 10 can be disposed at a same layer, and disposed in the non-display region 11b of the display panel 10 to realize a narrow bezel of the display panel 10. The first electrically connecting pad 1211, the second electrically connecting pad 1221, the switch 17, the first ground connecting portion 13, the second ground connecting portion 15, the first testing portion 14, and the second testing portion 16 are disposed in the display panel 10, for example, the first electrically connecting pad 1211, the second electrically pad 1221, the switch body 171, the switch lead 172, the first ground connecting lead 131, the second ground connecting lead 151, the first testing lead 141, the second testing lead 161, the first ground connecting pin 132, the second ground connecting pin 152, the first testing pin 142, the second testing pin 162 and, the switch pin 173 are disposed in the display panel 10. The first ground connecting pin 132 and the second ground connecting pin 152, the first testing pin 142, the second testing pin 162, and the switch pin 173 are disposed at an edge of the flexible circuit board 18.

The present disclosure further provides a method for testing a crack in the display panel. The display panel 10 has been described as above, and details therefore are not described again.

The method for testing a crack in the display panel 10 includes following steps: firstly, a turn-off voltage is inputted to the switch 17 to make an open circuit between the first ground connecting portion 13 and the first end 121 and between the second ground portion 15 and the second end 122. Then, confirmation can be made if the ground line 12 is broken by measuring a voltage, a resistance, or a current between the first testing portion 14 and the second testing portion 16. Finally, it can be inferred if a crack occurs on the display panel 10.

If a crack occurs in the display panel 10 during a cutting process, the ground line 12 will be broken. By measuring a voltage, a resistance, or a current between the first testing portion 14 and the second testing portion 16, it can be confirmed if the ground line 12 is broken. Then, we can infer if a crack occurs on the display panel 10.

When the voltage is measured by a voltmeter, the voltmeter is electrically connected between the first testing pin 142 and the second testing pin 162. When the measured voltage is zero, an open circuit must occur on the ground line 12. Therefore, it can be confirmed that a crack occurs on the non-display area 11b. On the contrary, when the measured voltage is within a predetermined range, the ground line 12 works normally. Therefore, it can be confirmed that a crack does not occur on the non-display region 11b.

When the resistance is measured by a resistance meter, the resistance meter is electrically connected between the first testing pin 142 and the second testing pin 162. When the measured resistance is infinity, an open circuit must occur on the ground line 12. Therefore, a crack is confirmed to occur on the non-display area 11b. When the measured resistance is within a predetermined range, the ground line 12 works normally. Therefore, a crack is confirmed not to occur on the non-display region 11b.

When the current is measured by an ammeter, the ammeter is electrically connected between the first testing pin 142 and the second testing pin 162. When a current is measured by an ammeter, the ammeter is electrically connected between the first testing pin 142 and the second testing pin. When the measured current is zero, an open circuit must occur on the ground line 12. Therefore, a crack is confirmed to occur on the non-display area 11b. On the contrary, when the measured current is within a predetermined range, the ground line 12 works normally. Therefore, it is confirmed that a crack does not occur on the non-display region 11b.

After finishing the test, when the ground line 12 is normal and a crack is decided to not exist in the non-display region 11b, the control circuit is turned on by the switch pin 173, the control circuit inputs an open voltage to the switch 17 to electrically connect the first ground connecting portion 13 with the ground line 12, and to restore the ground line 12 to a ground function.

The present disclosure provides a display panel and a method for testing for an occurrence of a crack in a display panel. The display panel includes a panel body, a ground line, a first ground connecting portion, a first testing portion, a second ground connecting portion, a second testing portion and a switch, the panel body includes a display region and a non-display region, the ground line is disposed in the non-display region and surrounds the display region, the ground line includes a first end and a second end, the first ground connecting portion and the first testing portion are parallel connected to the first end, the second ground connecting portion and the second testing portion are parallel connected to the second end, the switch is electrically connected between the first ground connecting portion and the first end, by measuring a voltage, a resistance, or a current between the first testing portion and the second testing portion, when the voltage is zero, the resistance is infinity or the current is zero, an open circuit is decided to exist in the ground line and a crack is decided to exist in the non-display region, thereby the difficulty of testing for an occurrence of a crack in the display panel is reduced.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel, comprising:
   a panel body, wherein the panel body comprises a display region and a non-display region;
   a ground line, wherein the ground line is disposed in the non-display region, surrounds the display region, and comprises a first end and a second end;
   a first ground connecting portion and a first testing portion, wherein the first ground connecting portion and the first testing portion are parallel electrically connected to the first end;
   a second ground connecting portion and a second testing portion, wherein the second ground connecting portion and the second testing portion are parallel electrically connected to the second end; and
   a switch, wherein the switch is electrically connected between the first ground connecting portion and the first end.

2. The display panel of claim 1, wherein the first ground connecting portion comprises a first ground connecting lead and a first ground connecting pin, the first ground connecting lead is electrically connected between the switch and the first ground connecting pin, the second ground connecting portion comprises a second ground connecting lead and a second ground connecting pin, and the second ground connecting lead is electrically connected between the second end and the second ground connecting pin.

3. The display panel of claim 1, wherein the first testing portion comprises a first testing lead and a first testing pin, the first testing lead is electrically connected between the first end and the first testing pin, the second testing portion comprises a second testing lead and a second testing pin, and the second testing lead is electrically connected between the second end and the second testing pin.

4. The display panel of claim 1, wherein the switch is a thin film transistor switch, and the switch is disposed in the non-display region of the panel body.

5. The display panel of claim 4, wherein the non-display region is disposed around the display region, the non-display region comprises a bonding region, and the bonding region is disposed at one side of the display region; and
the first ground connecting portion, the first testing portion, the second ground connecting portion, the second testing portion, and the switch are disposed in the bonding region.

6. The display panel of claim 4, wherein the display panel further comprises a flexible circuit board, the flexible circuit board is electrically connected to one side of the panel body, and the second ground connecting portion and the second testing portion are disposed at the flexible circuit board.

7. The display panel of claim 1, wherein the display panel further comprises a flexible circuit board, the flexible circuit board is electrically connected to one side of the panel body, and the first ground connecting portion, the first testing portion, the second ground connecting portion, the second testing portion, and the switch are disposed at the flexible circuit board.

8. The display panel of claim 1, wherein the first end comprises a first electrically connecting pad, the second end comprises a second electrically connecting pad, the first ground connecting portion and the first testing portion are electrically connected to the first electrically connecting pad, the second ground connecting portion and the second testing portion are electrically connected to the second electrically connecting pad, and the first electrically connecting pad and the second electrically connecting pad are disposed in the non-display region.

9. A method for testing for an occurrence of a crack in a display panel comprising:
providing a display panel, wherein the display panel comprises:
a panel body, wherein the panel body comprises a display region and a non-display region;
a ground line, wherein the ground line is disposed in the non-display region, surrounds the display region, and comprises a first end and a second end;
a first ground connecting portion and a first testing portion, wherein the first ground connecting portion and the first testing portion are parallel electrically connected to the first end;
a second ground connecting portion and a second testing portion, wherein the second ground connecting portion and the second testing portion are parallel electrically connected to the second end; and
a switch, wherein the switch is electrically connected between the first ground connecting portion and the first end;
inputting a turn-off voltage to the switch to make an open circuit between the first ground connecting portion and the first end;
measuring a voltage, a resistance, or a current between the first testing portion and the second testing portion; and
determining whether a crack exists or not in the non-display region according to the measured voltage, resistance, or current.

10. The method for testing for an occurrence of a crack in a display panel of claim 9, wherein the step of determining whether a crack exists or not in the non-display region according to the measured voltage, resistance, or current comprises:
when the measured voltage is zero, an open circuit is decided to exist in the ground line and a crack is decided to exist in the non-display region.

11. The method for testing for an occurrence of a crack in a display panel of claim 9, wherein the step of determining whether a crack exists or not in the non-display region according to the measured voltage, resistance, or current comprises:
when the resistance is infinity, an open circuit is decided to exist in the ground line and a crack is decided to exist in the non-display region.

12. The method for testing for an occurrence of a crack in a display panel of claim 9, wherein the step of determining whether a crack exists or not in the non-display region according to the measured voltage, resistance, or current comprises:
when the current is zero, an open circuit is decided to exist in the ground line and a crack is decided to exist in the non-display region.

13. The method for testing for an occurrence of a crack in a display panel of claim 9, wherein the step of determining whether a crack exists or not in the non-display region according to the measured voltage, resistance, or current comprises:
when the voltage is within a preset voltage range, the ground line is normal and a crack is decided to not exist in the non-display region.

14. The method for testing for an occurrence of a crack in a display panel of claim 9, wherein the first ground connecting portion comprises a first ground connecting lead and a first ground connecting pin, the first ground connecting lead is electrically connected between the switch and the first ground connecting pin, the second ground connecting portion comprises a second ground connecting lead and a second ground connecting pin, and the second ground connecting lead is electrically connected between the second end and the second ground connecting pin.

15. The method for testing for an occurrence of a crack in a display panel of claim 9, wherein the first testing portion comprises a first testing lead and a first testing pin, the first testing lead is electrically connected between the first end and the first testing pin, the second testing portion comprises a second testing lead and a second testing pin, and the second testing lead is electrically connected between the second end and the second testing pin.

16. The method for testing for an occurrence of a crack in a display panel of claim 9, wherein the switch is a thin film transistor switch, and the switch is disposed in the non-display region of the panel body.

17. The method for testing for an occurrence of a crack in a display panel of claim 16, wherein the non-display region is disposed around the display region, the non-display region comprises a bonding region, and the bonding region is disposed at one side of the display region; and the first ground connecting portion, the first testing portion, the second ground connecting portion, the second testing portion, and the switch are disposed in the bonding region.

18. The method for testing for an occurrence of a crack in a display panel of claim 16, wherein the display panel further comprises a flexible circuit board, the flexible circuit board is electrically connected to one side of the panel body, and the second ground connecting portion and the second testing portion are disposed at the flexible circuit board.

19. The method for testing for an occurrence of a crack in a display panel of claim 9, wherein the display panel further comprises a flexible circuit board, the flexible circuit board is electrically connected to one side of the panel body, and the first ground connecting portion, the first testing portion, the second ground connecting portion, the second testing portion, and the switch are disposed at the flexible circuit board.

20. The method for testing for an occurrence of a crack in a display panel of claim 9, wherein the first end comprises a first electrically connecting pad, the second end comprises a second electrically connecting pad, the first ground connecting portion and the first testing portion are electrically connected to the first electrically connecting pad, the second ground connecting portion and the second testing portion are electrically connected to the second electrically connecting pad, and the first electrically connecting pad and the second electrically connecting pad are disposed in the non-display region.

* * * * *